United States Patent [19]
Cutler et al.

[11] Patent Number: 5,729,181
[45] Date of Patent: Mar. 17, 1998

[54] HIGH THERMAL GAIN OVEN WITH REDUCED PROBABILITY OF TEMPERATURE GRADIENT FORMATION FOR THE OPERATION OF A THERMALLY STABLE OSCILLATOR

[75] Inventors: Leonard S. Cutler, Los Altos; Richard K. Karlquist, Cupertino; James R. Collin, Palo Alto; James L. Johnson, Morgan Hill; Theodore Parisek, San Jose; Robin P. Giffard, Los Altos, all of Calif.

[73] Assignee: Hewlett-Packard Company, Palo Alto, Calif.

[21] Appl. No.: 702,075

[22] Filed: Aug. 23, 1996

[51] Int. Cl.⁶ .................................. H03B 5/32; H03L 1/04
[52] U.S. Cl. ........................... 331/69; 331/158; 310/315; 310/343
[58] Field of Search .................................. 331/66, 68, 69, 331/70, 116 R, 116 FE, 158, 176; 310/315, 318, 343

[56] References Cited

U.S. PATENT DOCUMENTS

| | | | |
|---|---|---|---|
| 4,157,466 | 6/1979 | Herrin | 219/210 |
| 4,216,371 | 8/1980 | Marotel | 331/69 X |
| 4,317,985 | 3/1982 | Wilson | 219/210 |
| 4,396,892 | 8/1983 | Frerking et al. | 331/69 |
| 4,839,613 | 6/1989 | Echols et al. | 331/69 |
| 5,025,228 | 6/1991 | Gerard et al. | 331/69 |
| 5,041,800 | 8/1991 | Long et al. | 331/69 |

OTHER PUBLICATIONS

R. Brendel et al., "Analysis and Results of Compensated Quartz Crystal Oscillator Ovens," 1992 IEEE Frequency Control Symposium, IEEE Transaction No. 0-7803-0476-4/92, 1992, pp. 485-491.

Les Hurley, "A Temperature-Controlled Crystal Oscillator," 43rd Annual Symposium on Frequency Control-1989, IEEE Transaction No. CH2690-6/89/0000-055, 1989, pp. 55-57.

Marc Mourey et al., "A Space Oscillator with Cylindrical Oven and Symmetry," 45th Annual Symposium on Frequency Control, IEEE Transaction No. CH2965-2/91/0000-431, 1991, pp. 431-441.

Fred L. Walls, "Analysis of High Performance Compensated Thermal Enclosures," 41st Annual Frequency Control Symposium-1987, 1987, pp. 439-443.

*Primary Examiner*—David Mis

[57] ABSTRACT

An oven assembly for a crystal resonator and oscillator utilizes a thermally symmetrical design to provide a high thermal gain. The oven assembly includes an encasement that forms a hermetically sealed oven chamber that is substantially cylindrical. Concentric with the oven chamber is an annular oven mass that functions as a heat reservoir for the crystal resonator that is contained within the oven mass. The cylindrical oven chamber and the concentric annular oven mass provide two levels of circular symmetry that help achieve a thermally isotropic oscillator environment. Wide-area uniform heat transfer promotes high thermal gain and minimizes thermal gradients. Another factor is the geometry and circuitry for temperature monitoring. Temperature sensors are equidistantly spaced from each other and are equidistant from the center of the oven chamber. Signals from the various thermistors are averaged to provide a more accurate temperature determination for regulating the heaters.

18 Claims, 4 Drawing Sheets

HIGH THERMAL GAIN OVEN WITH REDUCED PROBABILITY OF TEMPERATURE GRADIENT FORMATION FOR THE OPERATION OF A THERMALLY STABLE OSCILLATOR

TECHNICAL FIELD

The invention relates generally to ovenized crystal oscillators and more particularly to a temperature-controlled oven assembly for a crystal oscillator.

BACKGROUND ART

Ovenized crystal oscillators are used in applications that require a highly stable output frequency. For example, radio communication applications require strict stability of a precise frequency. The telecommunications industry also includes applications in which output frequency must be subjected to exacting tolerances.

The crystals that are used to control the output of an oscillator are temperature dependent. In order to minimize the effects of static and dynamic shifts in the ambient temperature, the crystals are typically placed within a temperature-controlled oven. The fundamentals of such an oven are described in U.S. Pat. No. 4,317,985 to Wilson, which is assigned to Hewlett-Packard Company, the assignee of the present invention. The oven assembly isolates a crystal resonator from the external environment, with a thermistor being housed within the oven in order to monitor the temperature at a location close to the crystal. The thermistor is coupled to an oven controller that regulates the power applied to a heater of the oven. Consequently, the temperature of the quartz crystal is relatively insensitive to variations in the temperature of the atmosphere surrounding the oven, i.e. "ambient temperature."

"Thermal gain" is defined herein as a primary figure of merit for the temperature stabilization achieved by a crystal oven. More specifically, thermal gain is the ratio of the change in ambient temperature to the change in crystal temperature resulting from the ambient temperature variation. Thermal gain values of 8,000 have been reported for a single-level oven. If the oven is placed within one or more larger ovens, the thermal gain of the multi-level oven assembly may greatly exceed this value.

A number of techniques have been utilized to increase thermal gain. The Wilson patent describes a method that employs two heaters for heating a thermally conductive base on which the quartz crystal is positioned. The power applied to the first heater is responsive to the temperature sensed by a thermistor, while the power applied to the second heater is a multiple of the power applied to the first heater. The temperature is again sensed by the thermistor and the multiple is adjusted based upon the second temperature sensing. The patent states that by adjusting the ratio of the powers applied to the two heaters, the thermal gain between the thermistor and the external environment can be increased. Temperature control techniques are also described in U.S. Pat. No. 4,839,613 to Echols et al., U.S. Pat. No. 4,396,892 to Frerking et al., and U.S. Pat. No. 4,157,466 to Herrin. The use of compensating systems to offset influences of the external atmosphere on the temperature sensing of a crystal oscillator oven is described by F. Walls in "Analysis of High Performance Compensated Thermal Enclosures," 41st Annual Frequency Control Symposium—1987, pages 439–443, and by R. Brendel et al. in "Analysis and Results of Compensated Quartz Crystal Oscillator Ovens," 1992 IEEE Frequency Control Symposium, pages 485–491, IEEE Transaction 0-7803-0476-4/92 (1992).

In order to improve thermal gain, special construction techniques, in addition to circuit techniques, are utilized. In an article entitled "A Temperature-Controlled Crystal Oscillator," 43rd Annual Symposium on Frequency Control—1989, IEEE Transaction CH2690-6/89/000-055 (1989), Les Hurley describes an ovenless crystal oscillator that utilizes a double-sided beryllium oxide substrate having two power FET's, each in series with a current limiting resistor. The FET's and resistors form a heater structure that is arranged in a semi-circle around the crystal. Midway around the semi-circle, on the opposite side of the substrate, is a temperature sensing chip thermistor. The flow of heat from the power FET's to the crystal is through short, wide paths in the beryllium oxide substrate. The crystal is mounted inside a close-fitting copper ring which is soldered to the substrate metallization. Void spaces between the crystal and the copper ring are filled with a thermally conductive material. The crystal leads are soldered directly to the substrate metallization. The article asserts that because beryllium oxide has thermal properties nearly equal to those of metallic aluminum, and because the substrate area is small, the temperature gradients across the entire circuit are small. However, the article also reports some frequency instability due to the instability of the crystal temperature.

A thermal gain of greater than 2400 is reported by M. Mourey and R. Besson in an article entitled "A Space Oscillator with Cylindrical Oven and Symmetry" in 45th Annual Symposium on Frequency Control, pages 431–441, IEEE Transaction CH2965-2/91/0000-431 (1991). A cylindrical oven contains a resonator crystal. The oscillator is operated in space, with several reflectors being used to limit thermal exchanges by radiation. The oscillator is fixed by a titanium spacer, so as to limit exchanges by heat conduction. While the reported thermal gain is satisfactory for many applications, further improvements are necessary if oscillator performance is to be significantly enhanced.

What is needed is an oven and oscillator assembly having a high ratio of change in ambient temperature to a time-corresponding change in crystal temperature, so that the output frequency of the crystal oscillator has a low sensitivity to variations in the ambient temperature.

SUMMARY OF THE INVENTION

A crystal oscillator oven assembly combines a thermally symmetrical design with temperature sensing and heat distribution techniques that promote a high thermal gain, while reducing the sensitivity of the oven assembly to thermal gradients. In the preferred embodiment, the oven assembly includes an encasement that forms a sealed oven chamber that is substantially disk-shaped. Concentric with the cylindrical oven chamber is an annular oven mass that provides a heat reservoir for a crystal located within the oven mass. The shape of the oven chamber and the oven mass provide two levels of circular symmetry that achieve an approximately thermally isotropic oscillator environment.

Both the encasement and the oven mass are formed of a metal having a high thermal conductivity, such as copper. Preferably, the oven mass and at least a portion of the encasement are unitary. Such a one-piece structure is particularly advantageous if the oven chamber and oven mass are to be heated from the exterior of the encasement, since the one-piece structure does not present an oven mass-encasement interface through which thermal energy must pass. Moreover, the encasement preferably forms a hermetically sealed oven chamber.

Rather than providing localized heating, the assembly preferably includes wide-area heat transfer. A flexible circuit may be attached to one or both of the planar exterior surfaces of the cylindrical encasement. In the preferred embodiment, there is a heating element on each of the planar exterior surfaces and an independently controllable heating element on the exterior rim. The heating elements can be separately adjusted to establish a condition in which temperature about the encasement is substantially uniform. However, at the corners of the cylindrical encasement, there is often a benefit to increasing the pitch of the resistive traces that generate heat when connected to a source of electrical power. The wide-area heat transfer reduces the likelihood that thermal gradients will be introduced within the oven chamber.

Temperature monitoring within the oven chamber includes utilizing a number of heat sensors, such as thermistors, that are equidistantly spaced from each other and symmetrically located about the oven axis. In one embodiment, the heat sensors are all on a plane intersecting the effective thermal center of the crystal. The monitoring utilizes an averaging approach. Thus, the heat sensors are connected in series or in parallel or are connected to a separate averaging circuit for determining the temperature of the crystal oscillator based upon averaging signals from the heat sensors. By equidistantly spacing the heat sensors and by utilizing an averaging approach, there is a reduced risk that any temperature gradient that is present in the oven chamber will adversely affect performance of the crystal oscillator. The circuitry for determining temperature, or temperature error, is located within the oven chamber, so that external influences are minimized. However, the output of the circuitry is conducted to the exterior of the hermetically sealed oven chamber, allowing the output to be used to control operation of the heaters. Preferably, each signal output to the exterior of the oven chamber is passed through a plastic dielectric capacitor. The plastic dielectric capacitors do not affect electrical conductivity of the outputs, but inhibit the passage of thermal energy along the output paths. As an alternative to the single-plane embodiment, the heat sensors may be symmetrically arranged in a non-coplanar arrangement that permits three-dimensional averaging.

The heat sensors are embedded within the oven mass, as close as possible to the crystal, and are equidistant from the center of the oven chamber. This places the heat sensors within the thermal reservoir that plays perhaps the largest role in determining and maintaining the temperature of the crystal oscillator. The assembly includes a thermal guard for the leads of the heat sensors, so that the leads do not reduce the reliability of heat sensing by conducting thermal energy to or from the sensors. The thermal guard may be a wrap of insulating material on which the leads are deposited or placed around the outside diameter of the annular oven mass, guarding against heat leaks from the sensor leads to the exterior of the thermal reservoir.

In the single-plane embodiment, accurate determination of the temperature of the crystal resonator is further enhanced by locating the heat sensors and the crystal blank of the oscillator in the single plane. Because the thermal power is introduced from the exterior surfaces of the encasement, the position of the crystal blank relative to the exterior surfaces may be relevant to the determination of the crystal temperature. The coplanar arrangement accounts for this positioning in the determination of the crystal temperature. Moreover, the height of the assembly is less than conventional crystal oven encasements, so that the time delay from the heater or heaters to the heat sensors is minimized. A height of less than one centimeter is preferred, in order to reduce temperature differences and thermal delays and to facilitate the use of the oscillator in reduced height applications, such as card cages.

The encasement is contained within a metallic housing that insulates the encasement from the surrounding environment. A standard insulative foam may be utilized without a concern that outgassing from the insulative foam will enter the hermetically sealed region, i.e. the oven chamber. Outgassing into the area of the oscillator circuit may adversely affect performance.

The assembly may include the oscillator circuit within the oven chamber. The circuitry is preferably located between the outside diameter of the oven mass and the cylindrical interior surface of the encasement.

An advantage of the invention is that the thermally symmetrical preferred embodiment provides an ovenized environment that has reduced susceptibility to temperature gradients. That is, the oven assembly is substantially thermally isotropic. The small size of the assembly reduces effects of thermal gradients, since the spatial variations are likely to be smaller. The reduced size of the encasement also reduces power consumption.

Another advantage is that the equidistant spacing of the heat sensors from each other and the equidistant spacing of the heat sensors from the center of the oven chamber, combined with the averaging approach to determining crystal temperature, significantly increase the reliability of temperature detection for heater regulation. Additionally, the wide-area heat transfer from the heaters enhances the thermal characteristics of the assembly.

BEST MODE FOR CARRYING OUT THE INVENTION

Figure 1:
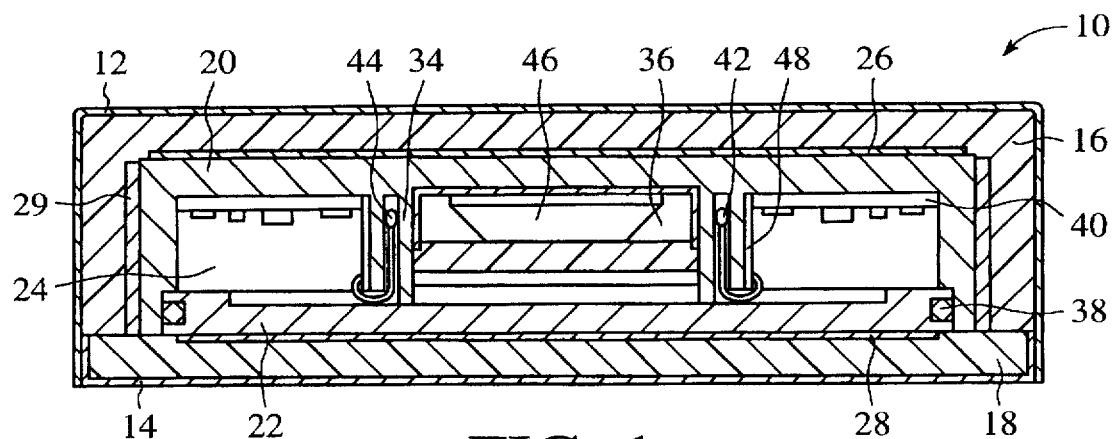
FIG. 1 is a side sectional view of a preferred embodiment of an ovenized crystal oscillator assembly in accordance with the invention.
Figure 2:
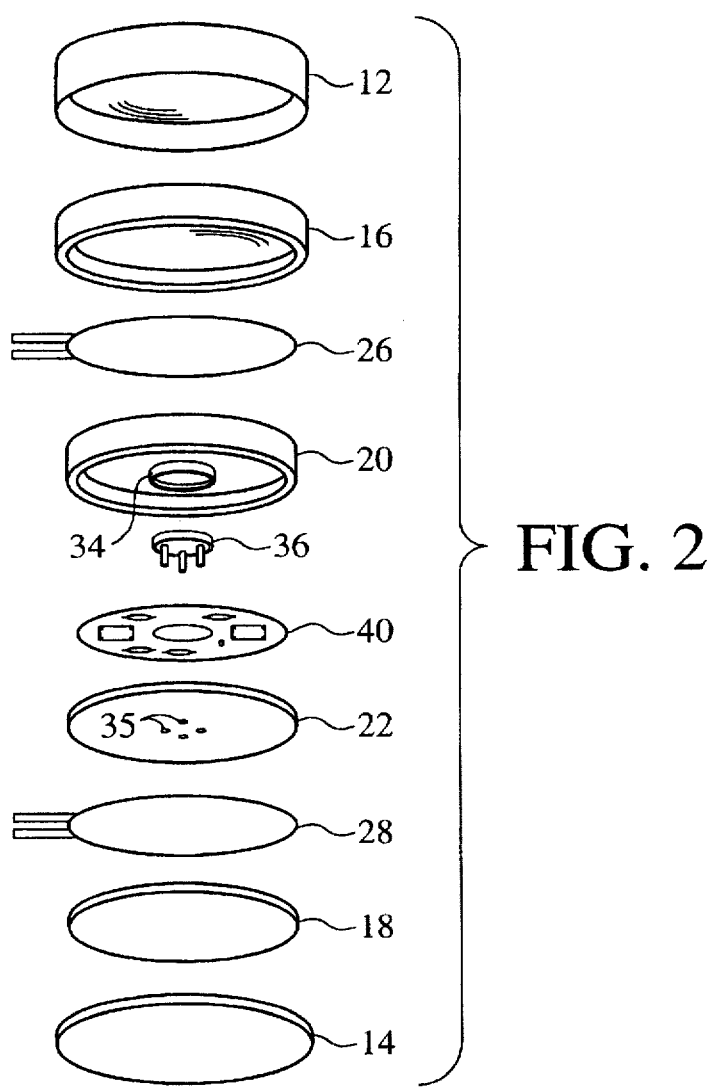
FIG. 2 is an exploded perspective view of the ovenized crystal oscillator assembly of FIG. 1.

With reference to FIGS. 1 and 2, an oven assembly 10 is shown as having an outer metallic housing that includes a cover 12 and a base 14. Contained within the housing is at least one piece of insulative foam 16 and 18. The housing is formed of metal, such as aluminum for thermal reasons or steel for magnetic shielding reasons, but this is not critical. Conventionally, the insulation is a synthetic foam, but the material is not critical to the invention.

In the preferred embodiment, the height of the oven assembly 10 does not exceed 19.05 mm. An exemplary diameter of the cover 12 of the housing is 76.2 mm.

Figure 3:
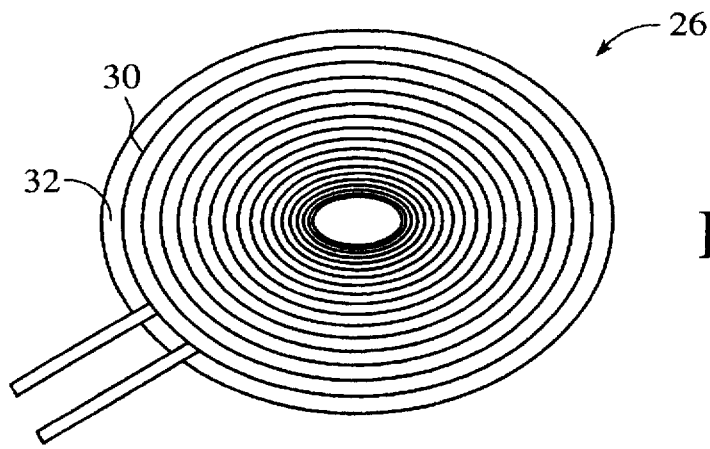
FIG. 3 is a perspective view of a heater of the assembly of FIGS. 1 and 2.

Supported within the insulative foam 16 and 18 is a metallic encasement that includes a cylindrical member 20 and a circular member 22. The cylindrical and circular members are attached to form a hermetically sealed oven chamber 24. As will be explained more fully below, the oven chamber is heated by conducting current through one or more resistive traces on an upper and lower heater 26 and 28. Preferably, there is a third heater 29 on the annular rim. In the preferred embodiment, the heaters are flex circuits having serpentine patterns that provide a wide-area heating approach. Referring briefly to FIG. 3, a resistive trace 30 is formed on an insulative material 32. The insulative material may be adhered to the planar surface of the cylindrical member 20 of FIG. 1. An advantage of the wide-area heating approach is that thermal power is introduced into the oven chamber relatively uniformly until a thermal equilibrium condition is reached. After equilibrium is established, the wide-area thermal coupling reduces the likelihood that temperature gradients will be established in the oven chamber 24. While embodiments have been contemplated for providing localized heating without diverging from the invention, the preferred embodiment is one in which generalized heating establishes wide-area thermal coupling from the heaters 26, 28 and 29 to the encasement that forms the oven chamber. This preferred embodiment also includes providing heaters at both planar surfaces and the rim of the encasement, since the multi-sided thermal coupling further promotes uniformity of thermal characteristics throughout the encasement and, therefore, throughout the oven chamber. The heater 29 on the rim is separately controlled and/or designed in order to provide a consistent thermal coupling along the exterior of the encasement. For example, the pattern of resistive traces of each heater may vary to compensate for variations in isolation wall thickness, or the ratio of power supplied to the rim heater to power supplied to the upper and lower heaters may be adjusted to reduce the likelihood that a thermal gradient will be formed within the oven chamber.

Figure 4:
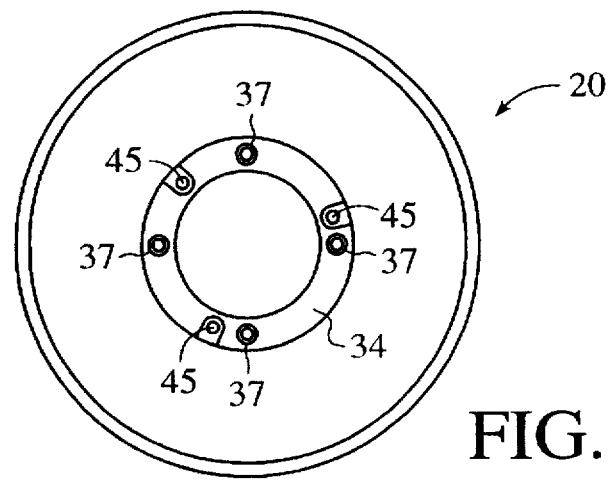
FIG. 4 is a bottom view of the cylindrical member and oven mass of the assembly of FIGS. 1 and 2.

Referring now to FIGS. 1, 2 and 4, formed with the cylindrical member 20 of the encasement is an oven mass 34 that is utilized to provide a thermal reservoir for maintaining a fixed temperature for a crystal 36. The oven mass extends from the interior surface of the cylindrical member 20, and contacts the interior surface of the circular member 22 of the encasement. Since the oven mass and the cylindrical member 20 have a one-piece structure, thermal power introduced from the upper heater 26 does not encounter an interface in a thermal coupling from the cylindrical member to the oven mass. While there is such an interface at the contact with the oven mass and oven chamber with the circular member 22, the heat-transfer characteristics may be improved by maintaining tight manufacturing tolerances and by applying a conductive material at the interface. Moreover, the thermal contact of the circular member 22 to the oven chamber could be improved by partially evacuating the hermetically sealed oven chamber and allowing the external ambient pressure to thus increase the contact pressure.

The hermetic seal of the oven chamber 24 is maintained by an O-ring 38 at the connection of the cylindrical and circular members 20 and 22 of the encasement. Screws pass through an array of holes 35 in the circular member and are received within internally threaded bores 37 in the oven mass 34 to fix the circular member to the cylindrical member. While not shown, each screw passes through a small O-ring prior to insertion into one of the holes 35, so that the integrity of the hermetic seal is preserved. An advantage of this fastening arrangement is that the oscillator remains accessible to a user. Mounted within the oven chamber 24 is a printed circuit board 40. The printed circuit board is an annular substrate having circuitry for exciting and operating the crystal oscillator 36. Preferably, the heat-generating components of the circuit are symmetrically arranged around the printed circuit board 40, thereby preserving the thermal symmetry promoted by the geometries of the encasement and the oven mass 34.

Embedded within the oven mass 34 are a number of heat sensors, such as the two thermistors 42 and 44 shown in FIG. 1. The sectional view of FIG. 1 illustrates two diametrically opposed thermistors, but there are preferably at least three thermistors. Structure for a three-sensor arrangement is shown in FIG. 4. Each thermistor is equidistantly spaced from immediately adjacent thermistors. Moreover, there is a fixed distance between the center of the oven chamber 24 and a thermistor. FIG. 4 illustrates three openings 45 for receiving thermistors. Such an arrangement is designed to provide a highly accurate determination of crystal temperature. As will be described more fully below, the signals from the thermistors are utilized in an averaging approach to determine crystal temperature for controlling the heaters 26, 28 and 29. As a result, any adverse effects on oscillator performance that may result from creation of temperature gradients within the thermal reservoir formed by the oven mass 34 are minimized.

In the preferred embodiment, the thermistors 42 and 44 are positioned along the same cross sectional plane as the crystal blank 46 in FIG. 1. While the use of the oven mass 34 to create a thermal reservoir significantly reduces the risk of thermal gradients that are dependent upon the distance of the crystal 36 from the heaters 26 and 28, the positioning of the thermistors along the same plane as the crystal blank provides a further safeguard against thermal gradients adversely affecting crystal performance. Alternatively, three-dimensional averaging can be achieved if more than three thermistors are arranged in a non-coplanar but symmetrical manner.

In the preferred embodiment, leads from the thermistors 42 and 44 are shielded from the exterior surface of the oven mass 34 by a thermal guard 48. The thermal guard is a thin electrically insulative material that contains conductors and that is wrapped about the cylindrical outer surface of the oven mass. The thermal guard may include embedded conductors that channel the signals from the thermistors to a region from which the signals are to be conducted to the averaging circuit. The thermal guard functions to protect the thermistor leads from conducting thermal energy to and from the thermistors, thereby increasing the accuracy of monitoring the temperature of the crystal 36.

The method of conducting signals and power to and from the interior of the encasement formed by the cylindrical and circular members 20 and 22 is critical if the hermetic seal is to be preserved. In one embodiment, hermetic feedthroughs are mounted through the upper surface of the cylindrical member 20, with leads extending through cylindrical insulative members to prevent electrical shorts to the metallic encasement and to preserve the seal. A flexible circuit may then be used to conduct the signals and utilities to the exterior of the housing formed by the cover 12 and base 14. Preferably, each input and output signal passes through a plastic dielectric capacitor. The plastic dielectric capacitors permit electrical conduction into and out of the housing, but inhibit thermal conduction.

The operation of the oven assembly 10 is described with reference to FIG. 5. Three thermistors 42, 44, and 50 are shown as being contained within the hermetically sealed oven chamber 24. Signals from the thermistors are conducted to an averaging circuit 52. The assembly of FIG. 1 may be surface mounted to a printed circuit board that includes a control circuit 54. The three thermistors are substantially identical and are of the type that could be used individually in a temperature monitoring and regulating circuit. However, in FIG. 5, the three thermistors provide inputs to the averaging circuit 52 which determines the crystal temperature based upon an averaging process.

Figure 6:
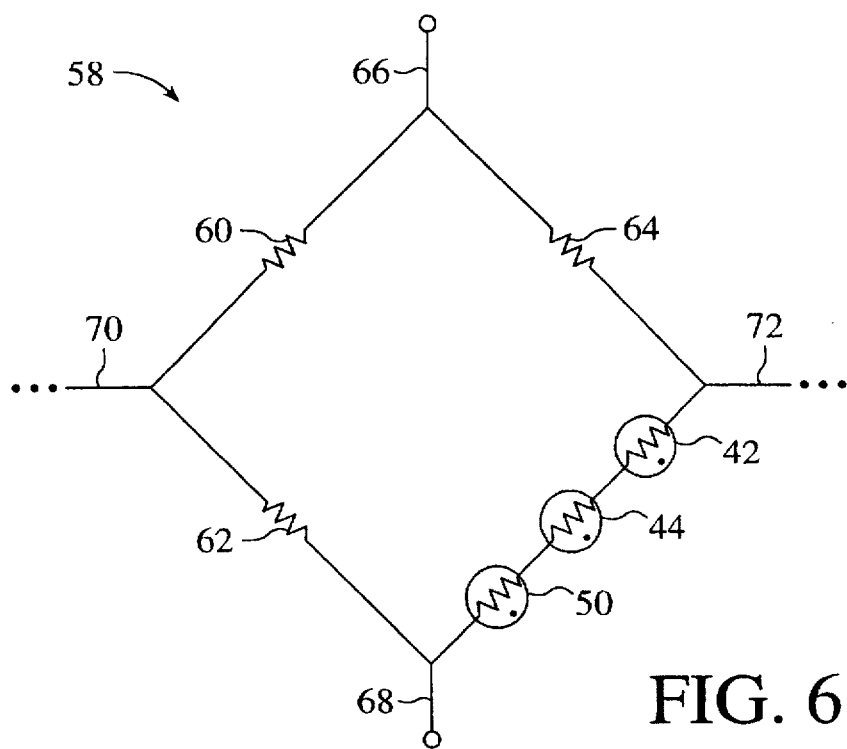
FIG. 6 is a schematic diagram of a preferred embodiment for providing an averaged thermistor output signal.

Referring now to FIG. 6, a preferred embodiment for executing the thermistor averaging is shown as including a bridge circuit 58. This bridge circuit is less complex than an embodiment that requires a separate averaging circuit, such as shown in FIG. 5. One leg of the bridge circuit 58 includes the three thermistors 42, 44 and 50 in electrical series. Each of the other three legs includes a resistor 60, 62 and 64 having a value selected to permit the bridge to operate in the manner of a conventional Wheatstone bridge. The resistors are located on the oscillator circuit within the oven chamber, so that only the power lines 66 and 68 and the signal lines 70 and 72 exit the oven chamber. Since the error is the electrical difference between the two signal lines, the temperature sensing is implemented with little susceptibility to exterior thermal influences.

As an alternative to the bridge circuit 58 of FIG. 6, the three thermistors 42, 44 and 50 may be connected in electrical parallel to form one leg of the bridge circuit. With either the series or parallel arrangement, averaging occurs in determining an input to a heater control circuit.

Figure 5:
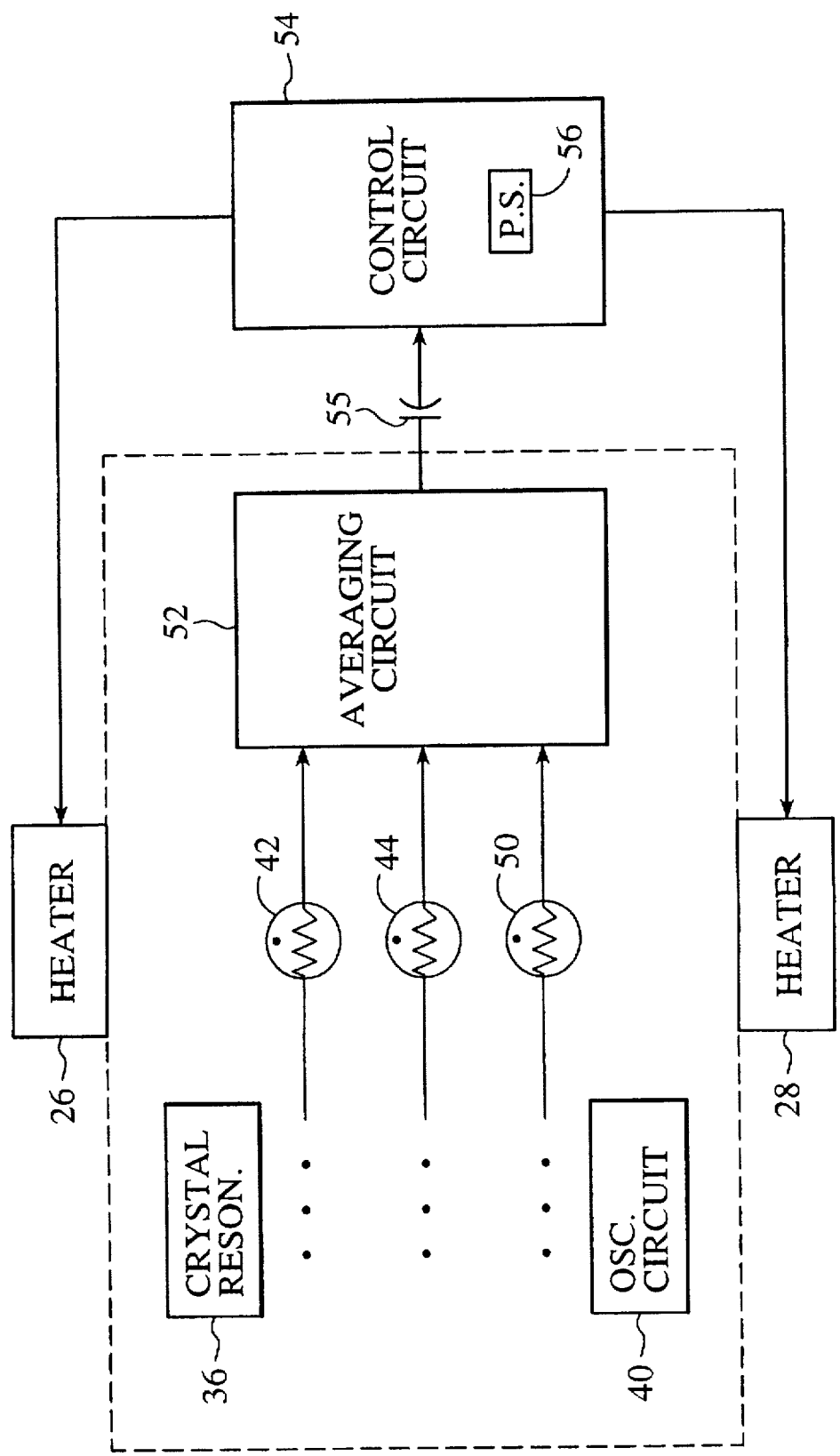
FIG. 5 is a block diagram of selected components for operating the assembly of FIG. 1.

Returning to the less preferred embodiment of FIG. 5, the components of the averaging circuit 52 may merely be additive and divide-by-three components. That is, the three output signals from the thermistors 42, 44 and 50 are summed and an average of the three detected temperatures is calculated. Averaging circuits are known to persons skilled in the art.

The output of the averaging circuit 52 is connected to the control circuit 54 via a plastic dielectric capacitor 55 that inhibits thermal conductivity. Control circuits are conventionally used in the operation of ovenized crystal oscillators. A power supply 56 is shown as being part of the control circuit. Operation of the circuits 52 and 54 may be used to regulate dynamically current flow to the upper, lower and rim heaters 26, 28 and 29, or may be used to vary the duty cycles for heat generation based upon the calculation of the temperature at the crystal resonator 36.

The desired operating temperature depends upon a number of factors, particularly the crystal resonator 36 that is used. As an example, the operating temperature may be maintained at 80° C. Referring now to FIGS. 1–6, tests of the oven assembly 10 have shown a thermal gain of in excess of 100,000. This is more than an order of magnitude beyond conventional single oven assemblies for crystal oscillators. The testing was performed using the B-mode of SC cut crystal operation, which has a large temperature coefficient and is therefore very useful for temperature measurement.

Figure 7:
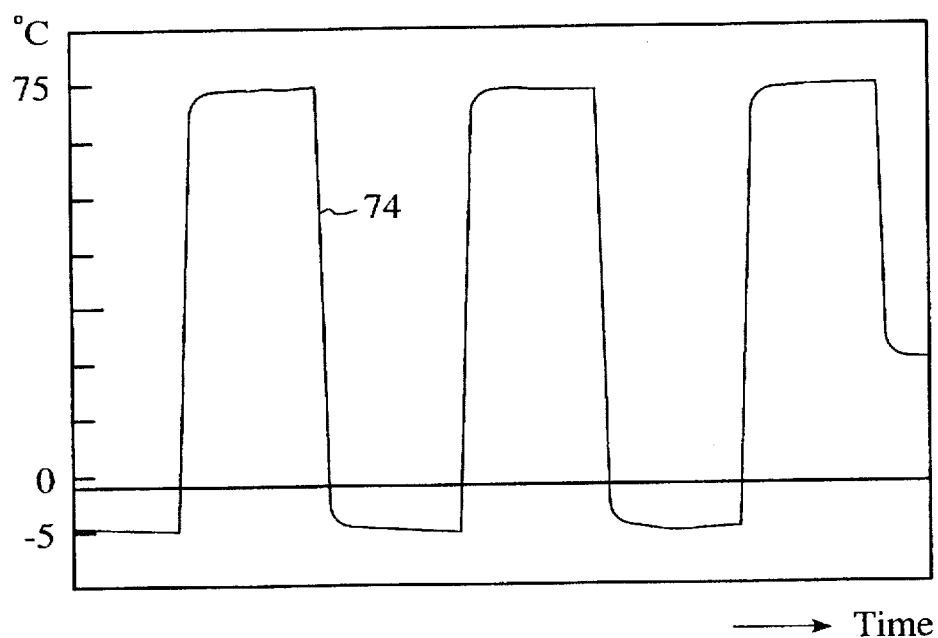
FIGS. 7 and 8 are graphs of data acquired in testing an ovenized crystal oscillator assembly formed in accordance with the invention.
Figure 8:
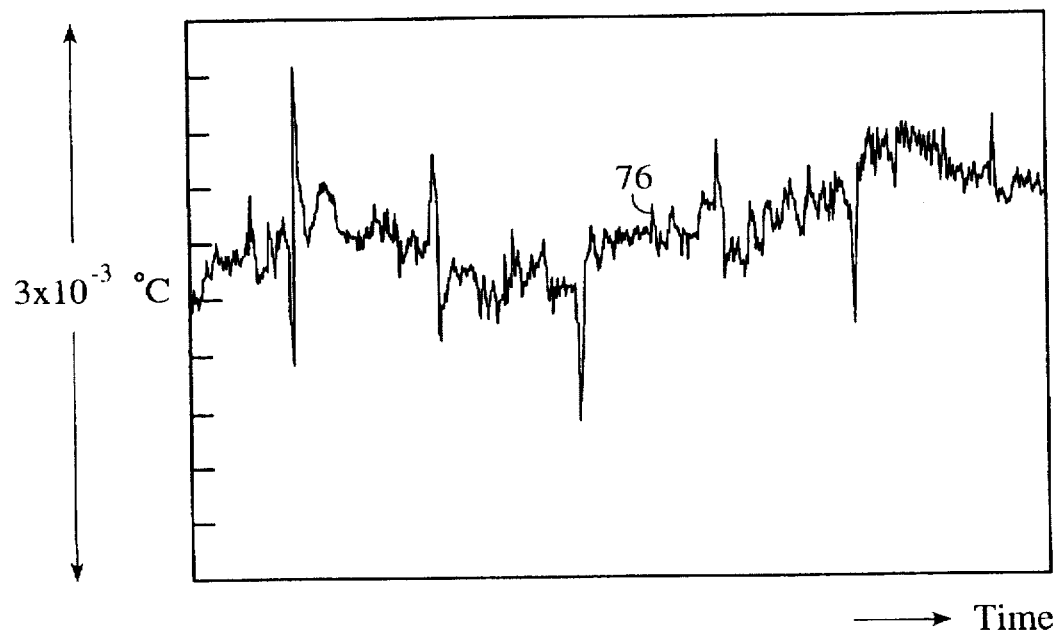

FIGS. 7 and 8 are graphs of data acquired for a crystal oscillator oven assembled according to the invention. The graph 74 illustrates a regulated change in the ambient temperature of the crystal oscillator oven. The ambient temperature was changed between −5° C. and 75° C. three times over a period of approximately twenty-four hours. The graph 76 illustrates the measured change in crystal temperature over the same twenty-four hour period. While small spikes occurred at each ambient temperature switch, the crystal temperature quickly stabilized and the static change was less than $1 \times 10^{-3}$° C. The substantial temperature variations used in acquiring the data of FIGS. 7 and 8 provided increased understanding of the performance of the ovenized crystal oscillator assembly.

The high thermal gain is at least partially a result of the geometry of the oven assembly 10. A thermally symmetrical design reduces the susceptibility of the assembly to thermal gradients. The oven assembly 24 is circular in horizontal cross section, as viewed in FIG. 1. Compared to conventional rectangular oven chambers, the oven chamber of the illustrated invention enhances temperature uniformity. Locating the thermal reservoir that contains the crystal 36 concentrically with the oven chamber further enhances uniformity.

The wide-area thermal coupling provided by the upper, lower and rim heaters 26, 28 and 29 further reduces the risk of temperature gradients within the oven chamber 24. Again referring to the orientation of FIG. 1, the relatively small height and the provision of the thermal reservoir operate to provide temperature uniformity in the vertical direction. The insulative foam 16 and 18 increases heating efficiency without the risk of outgassing causing chemical migration that would adversely affect operation of the crystal oscillator 36. Since the insulative foam is outside of the hermetic seal, gases generated as a result of heating the insulation will not enter the oscillator.

Symmetry is also considered in the monitoring of crystal temperature. The thermistors 42, 44 and 50 are equidistantly spaced from each other and from the center of the crystal 36. Moreover, the thermistors are preferably along the same horizontal plane as the crystal blank 46, so that the monitoring is at a position that corresponds to the distance of the crystal blank from the two heaters 26 and 28.

We claim:

1. An oven assembly for an oscillator comprising:
   a cylindrical encasement defining a sealed oven chamber having a substantially circular cross section to promote thermal symmetry along said cross section;
   a thermally conductive cylindrical oven mass located within said oven chamber to provide a thermal reservoir, said oven mass having a substantially circular cross section that is generally concentric with said circular cross section of said encasement, said oven mass being unitary with a portion of said encasement;
   a crystal located within said oven mass in thermal engagement with said thermal reservoir;
   a heater connected to said encasement to heat said oven chamber; and
   at least one heat sensor located within said oven chamber for monitoring temperature.

2. The oven assembly of claim 1 wherein at least three of said heat sensors are substantially equidistantly spaced within said oven chamber such that localized temperature sensing within said oven chamber is a symmetrical arrangement.

3. The oven assembly of claim 2 wherein said heat sensors are thermistors and are connected to a circuit for controlling said heater, said circuit for controlling said heater being responsive to an averaging approach with respect to said heat sensors.

4. The oven assembly of claim 1 wherein said encasement is disk-shaped and wherein said heater is a conductive circuit on at least one exterior surface of said encasement.

5. The oven assembly of claim 1 further including a metallic housing, said encasement being supported within said metallic housing by insulation, said oven chamber being hermetically sealed from said insulation.

6. The oven assembly of claim 1 wherein said oven mass has an annular geometry and wherein said crystal is located within an inside diameter of said oven mass.

7. The oven assembly of claim 6 wherein said oven mass is formed of copper and a difference between said inside diameter and an outside diameter of said oven mass is at least 2.5 mm.

8. An oscillator assembly comprising:
a metallic oven encasement forming a hermetically sealed oven chamber, said oven encasement being substantially disk-shaped;
a metallic oven mass within said oven chamber;
a crystal substantially enclosed within said oven chamber by said oven mass;
at least three thermistors in thermal contact with said oven mass, said thermistors being oriented in one of a coplanar and a three-dimensionally symmetrical orientation with respect to a crystal blank, said thermistors including a thermal guard to reduce susceptibility of said thermistors from channeling thermal energy to and from said thermistors;
a monitoring circuit electrically connected to said thermistors to determine the temperature at said crystal, said monitoring circuit having an output that is indicative of an average of signals from said thermistors;
a heater thermally coupled to said oven encasement, said heater being responsive to said monitoring circuit, said heater extending along a major portion of at least one exterior surface of said oven encasement; and
a source of power connected to said heater.

9. The assembly of claim 8 wherein said oven mass is annular, said oven encasement and said oven mass being coaxial.

10. The assembly of claim 9 wherein said heater includes a serpentine resistive trace on a flexible circuit extending along said exterior surface of said oven encasement.

11. The assembly of claim 8 wherein said plurality of equidistantly spaced thermistors and said crystal are coplanar, such that said output of said monitoring circuit is based upon a two-dimensional average of thermistor signals.

12. The assembly of claim 8 wherein said equidistantly spaced thermistors are non-coplanar and said output of said monitoring circuit is based upon a three-dimensional average of thermistor signals.

13. The assembly of claim 8 further comprising an oscillator circuit within said oven circuit for controlling said crystal.

14. An oven assembly for an oscillator comprising:
a generally disk-shaped metal encasement forming a hermetically sealed oven chamber;
an annular oven mass within said oven chamber to provide a thermal reservoir;
a crystal resonator within an inside diameter of said oven mass;
an oscillator circuit within said oven chamber and beyond an outside diameter of said oven mass, said oscillator circuit being electrically connected to said crystal resonator;
a plurality of equidistantly spaced temperature sensors located about said oven mass;
first and second heaters extending along opposed planar exterior surfaces of said metal encasement to heat said oven chamber; and
insulation surrounding said metal encasement.

15. The oven assembly of claim 14 further comprising a metallic housing containing said insulation and said metal encasement.

16. The oven assembly of claim 14 further comprising a third heater thermally coupled to said metal encasement on a circular exterior surface.

17. An oven assembly for an oscillator comprising:
an encasement defining a sealed oven chamber having a substantially circular cross section to promote thermal symmetry along said cross section;
a thermally conductive oven mass located within said oven chamber to provide a thermal reservoir, said oven mass having a substantially circular cross section that is generally concentric with said circular cross section of said encasement;
a crystal located within said oven mass in thermal engagement with said thermal reservoir;
a heater connected to said encasement to heat said oven chamber; and
a plurality of thermistors embedded within said oven mass for monitoring temperature.

18. The oven assembly of claim 16 further comprising a thermal guard to reduce susceptibility of leads of said thermistors from channeling thermal energy to and from said thermistors.

* * * * *